: US010396056B2

(12) United States Patent
Soyano

(10) Patent No.: US 10,396,056 B2
(45) Date of Patent: Aug. 27, 2019

(54) SEMICONDUCTOR DEVICE AND SEMICONDUCTOR DEVICE FABRICATION METHOD

(71) Applicant: FUJI ELECTRIC CO., LTD., Kawasaki-shi, Kanagawa (JP)

(72) Inventor: Shin Soyano, Shiojiri (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 45 days.

(21) Appl. No.: 15/176,211

(22) Filed: Jun. 8, 2016

(65) Prior Publication Data

US 2017/0006721 A1    Jan. 5, 2017

(30) Foreign Application Priority Data

Jul. 1, 2015   (JP) ................. 2015-132789

(51) Int. Cl.
*H01L 25/07* (2006.01)
*H05K 1/02* (2006.01)

(52) U.S. Cl.
CPC .......... *H01L 25/07* (2013.01); *H05K 1/0263* (2013.01); *H01L 2224/48472* (2013.01); *H01L 2224/49111* (2013.01); *H01L 2224/49175* (2013.01); *H01L 2224/49431* (2013.01); *H05K 2201/1059* (2013.01); *H05K 2201/10272* (2013.01); *H05K 2203/1327* (2013.01)

(58) Field of Classification Search
CPC .......... H01L 25/07; H01L 2224/49431; H01L 2224/49175; H01L 2224/49111; H01L 2224/48472; H01L 23/04; H01L 23/043; H01L 25/041; H01L 25/065; H01L 25/165; H05K 1/0263; H05K 2203/1327; H05K 2201/1059; H05K 2201/10272
See application file for complete search history.

(56) References Cited

U.S. PATENT DOCUMENTS

| 5,424,579 | A | * | 6/1995 | Arai ................ H01L 23/492 257/689 |
| 5,625,536 | A | * | 4/1997 | Soyano ............ H01L 23/24 174/529 |
| 6,129,584 | A | * | 10/2000 | Chiba ............. H01R 43/205 439/573 |
| 9,214,415 | B2 | * | 12/2015 | Denison ........... H01L 25/071 |
| 2001/0038143 | A1 | * | 11/2001 | Sonobe ........... H01L 24/49 257/690 |
| 2003/0015778 | A1 | * | 1/2003 | Soyano ............ H01L 23/045 257/678 |

(Continued)

FOREIGN PATENT DOCUMENTS

| JP | H05-206183 A | 8/1993 |
| JP | 2000-323646 A | 11/2000 |
| JP | 2002-164500 A | 6/2002 |

*Primary Examiner* — Steven T Sawyer
*Assistant Examiner* — Sagar Shrestha
(74) *Attorney, Agent, or Firm* — Rabin & Berdo, P.C.

(57) ABSTRACT

A semiconductor device includes a printed circuit board in a peripheral portion of a housing portion of a case in which a laminated substrate is housed. A terminal block holding control terminals from which control signals are outputted to the printed circuit board is disposed over the printed circuit board. A gate electrode of a semiconductor chip and the printed circuit board are electrically connected by a wire.

13 Claims, 16 Drawing Sheets

(56) References Cited

U.S. PATENT DOCUMENTS

| | | | |
|---|---|---|---|
| 2004/0113268 A1* | 6/2004 | Shirakawa | H01L 23/5383 257/724 |
| 2008/0144290 A1* | 6/2008 | Brandt | B60R 16/0239 361/720 |
| 2009/0262503 A1* | 10/2009 | Kaneko | H05K 7/026 361/706 |
| 2010/0148298 A1* | 6/2010 | Takano | H01L 23/49575 257/500 |
| 2014/0166352 A1* | 6/2014 | Ueda | H05K 5/065 174/258 |
| 2015/0044889 A1* | 2/2015 | Wang | H01R 12/707 439/83 |

\* cited by examiner

SEMICONDUCTOR DEVICE AND SEMICONDUCTOR DEVICE FABRICATION METHOD

CROSS-REFERENCE TO RELATED APPLICATION

This application is based upon and claims the benefit of priority of the prior Japanese Patent Application No. 2015-132789, filed on Jul. 1, 2015, the entire contents of which are incorporated herein by reference.

BACKGROUND OF THE INVENTION

1. Field of the Invention

The embodiments discussed herein are related to a semiconductor device and a semiconductor device fabrication method.

2. Background of the Related Art

Power semiconductor modules (semiconductor devices) include semiconductor chips, such as insulated gate bipolar transistors (IGBTs), metal oxide semiconductor field effect transistors (MOSFETs), and free wheeling diodes (FWDs), and are widely used as power converters.

With such semiconductor devices, a laminated substrate including an insulating board and a circuit pattern made of copper foil which is formed on the insulating board is housed in a case. The above semiconductor chips are disposed over the copper foil. Furthermore, the laminated substrate and the semiconductor chips in the case are wired. Electrodes of the semiconductor chips are electrically connected by wires and the electrodes of the semiconductor chips and external electrode terminals are electrically connected by wires. These components in the case are sealed with resin (see, for example, Japanese Laid-open Patent Publication No. 2000-323646).

By the way, with improvement in the function of a semiconductor chip included in a semiconductor device, the number of wirings per element of a control signal system tends to increase. Accordingly, in order to prevent wirings in a case of a semiconductor device from becoming complicated, the following method, for example, is tried for simplifying wiring connection. A circuit pattern and the like are formed over a laminated substrate and the circuit pattern is used for wiring routing.

However, even if a circuit pattern is used, an increase in the number of wirings leads to complicated wiring routing. As a result, assemble-ability deteriorates and man-hours needed for wiring work increase. Furthermore, with wirings of a control signal system a magnetic field or the like produced at switching time has an influence on the characteristics of a product, depending on a routing method. As a result, a malfunction may occur.

SUMMARY OF THE INVENTION

According to an aspect, there is provided a semiconductor device including a laminated substrate including an insulating board and a circuit board disposed over a front surface of the insulating board, a semiconductor chip disposed over the circuit board, a case having a housing area for housing the laminated substrate and the semiconductor chip, a terminal block having a first surface and a second surface opposite the first surface and holding external connection terminals protruding from the first surface and the second surface, and a printed circuit board having a first principal plane and a second principal plane opposite the first principal plane, disposed over a periphery of the housing area, held on a second surface side of the terminal block, electrically connected to a control electrode of the semiconductor chip by a connecting member, and connected to the external connection terminals.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
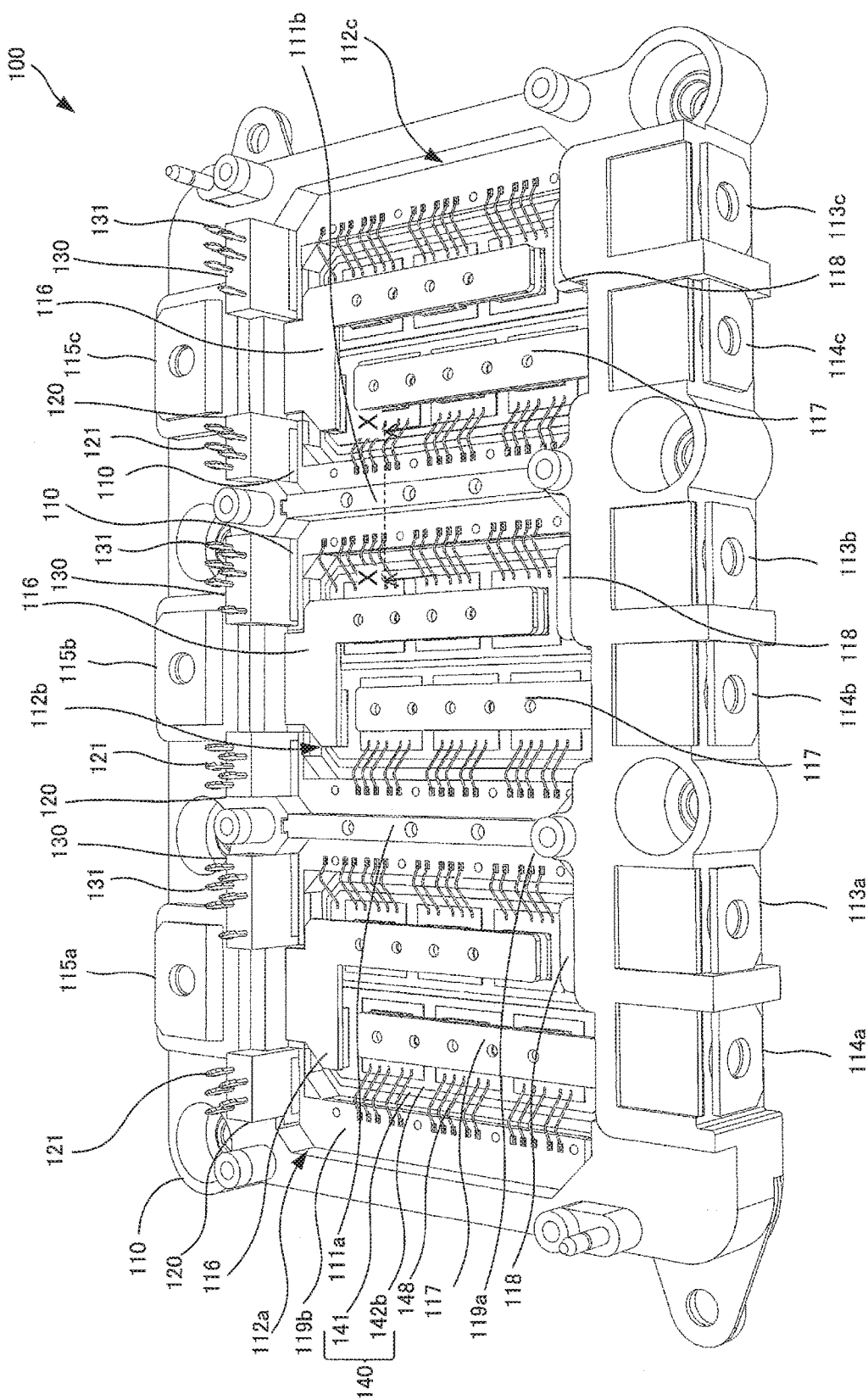
FIG. 1 is a perspective view of a semiconductor device according to a first embodiment.

Embodiments will now be described with reference to the accompanying drawings, wherein like reference numerals refer to like elements throughout.

(First Embodiment)

First a semiconductor device according to a first embodiment will be described by the use of FIG. 1.

FIG. 1 is a perspective view of a semiconductor device according to a first embodiment.

A semiconductor device 100 includes a case 110 and laminated substrates 140 housed in housing portions 112a, 112b, and 112c of the case 110.

With the semiconductor device 100, a positive electrode is connected to P terminals 113a, 113b, and 113c and a negative electrode is connected to N terminals 114a, 114b, and 114c. A control signal is applied to each of control terminals 121 and 131. An output corresponding to a control signal is obtained from each of a U terminal 115a, a V terminal 115b and a W terminal 115c.

The details of the case 110 included in the above semiconductor device 100 and the laminated substrates 140 housed in the case 110 will be described later.

A method for fabricating the semiconductor device 100 will now be described by the use of FIG. 2.

Figure 2:
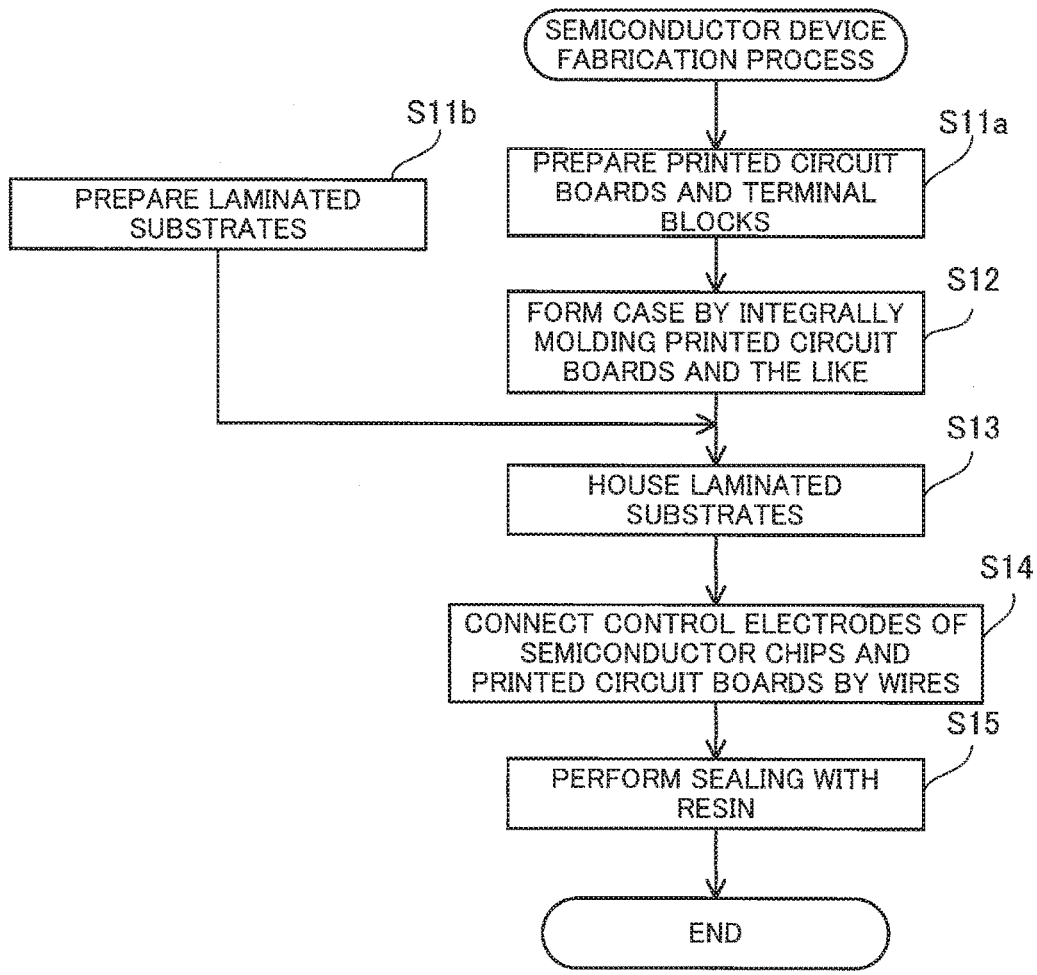
FIG. 2 is a flow chart of a method for fabricating the semiconductor device according to the first embodiment.

FIG. 2 is a flow chart of a method for fabricating the semiconductor device according to the first embodiment.

(Step S11) Printed circuit boards 119a and 119b and terminal blocks 120 and 130 are prepared (step S11a). Furthermore, the laminated substrates 140 are prepared (step S11b). In step S11a, control terminals 121 and 131 of the terminal blocks 120 and 130, respectively, are press-fitted in the printed circuit boards 119a and 119b to hold the printed circuit boards 119a and 119b on an under surface side of the terminal blocks 120 and 130.

The laminated substrate 140 will now be described by the use of FIG. 3.

Figure 3:
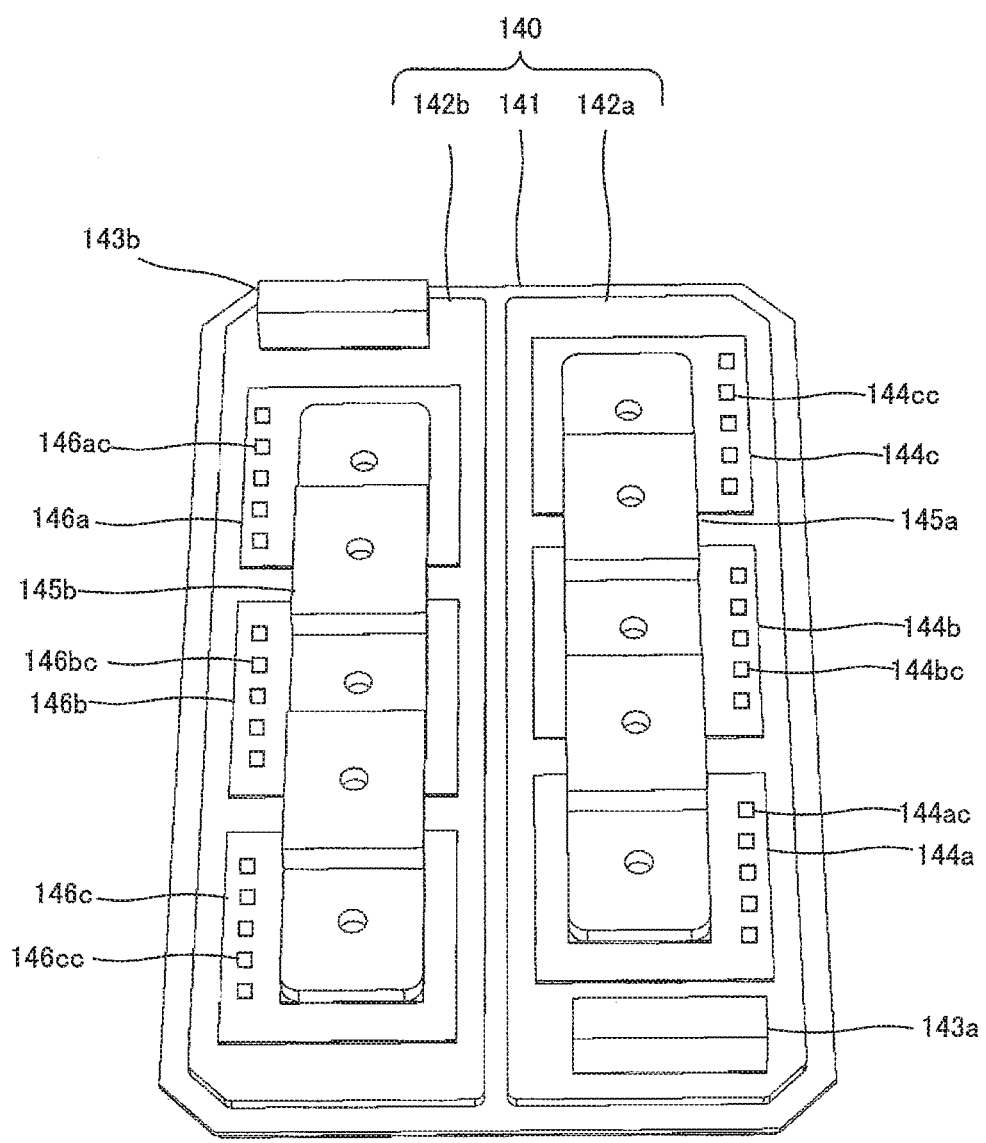
FIG. 3 is a perspective view which illustrates a state in which parts are mounted over an insulating substrate of the semiconductor device according to the first embodiment.

FIG. 3 is a perspective view which illustrates a state in which parts are mounted over an insulating substrate of the semiconductor device according to the first embodiment.

The laminated substrate 140 includes a radiation plate (not illustrated) made of, for example, copper or the like and disposed over an under surface of an insulating substrate 141 and circuit boards 142a and 142b made of, for example, copper foil or the like and disposed over an upper surface of the insulating substrate 141.

For example, a conductive terminal 143a made of copper is disposed on the lower side of the circuit board 142a in FIG. 3 and (collector electrodes of) semiconductor chips 144a, 144b and 144c are aligned over the circuit board 142a with solder therebetween. Furthermore, a straight lead frame 145a is disposed with solder therebetween over emitter electrodes of the aligned semiconductor chips 144a, 144b and 144c. As a result, the emitter electrodes of the semiconductor chips 144a, 144b and 144c are electrically connected to one another.

For example, a conductive terminal 143b made of copper is disposed on the upper side of the circuit board 142b in FIG. 3 and (collector electrodes of) semiconductor chips 146a, 146b and 146c are aligned over the circuit board 142b with solder therebetween. Furthermore, a straight lead frame 145b is disposed with solder therebetween over emitter electrodes of the aligned semiconductor chips 146a, 146b and 146c. As a result, the emitter electrodes of the semiconductor chips 146a, 146b and 146c are electrically connected to one another.

An IGBT, a MOSFET, a FWD, or the like is used as the semiconductor chip 144a, 144b, 144c, 146a, 146b or 146c. In the example of FIG. 3, a reverse conducting IGBT (RC-IGBT) is used as, for example, the semiconductor chip 144a. In addition to main electrodes (emitter electrodes and the collector electrodes), the semiconductor chips 144a, 144b, 144c, 146a, 146b and 146c have a plurality of control electrodes 144ac, 144bc, 144cc, 146ac, 146bc and 146cc, respectively, connected to gate terminals, sense terminals, and chip temperature measurement terminals.

In the example of FIG. 3, the emitter electrodes of the semiconductor chips 144a, 144b and 144c are connected by the lead frame 145a. However, the emitter electrodes of the semiconductor chips 144a, 144b and 144c may be connected by another method. That is to say, the emitter electrodes of the semiconductor chips 144a, 144b and 144c may be connected by a wire made of aluminum or the like. Similarly, the emitter electrodes of the semiconductor chips 146a, 146b and 146c may be connected by a wire.

Next, the terminal blocks 120 and 130 will be described by the use of FIGS. 4 through 7.

Figure 4:
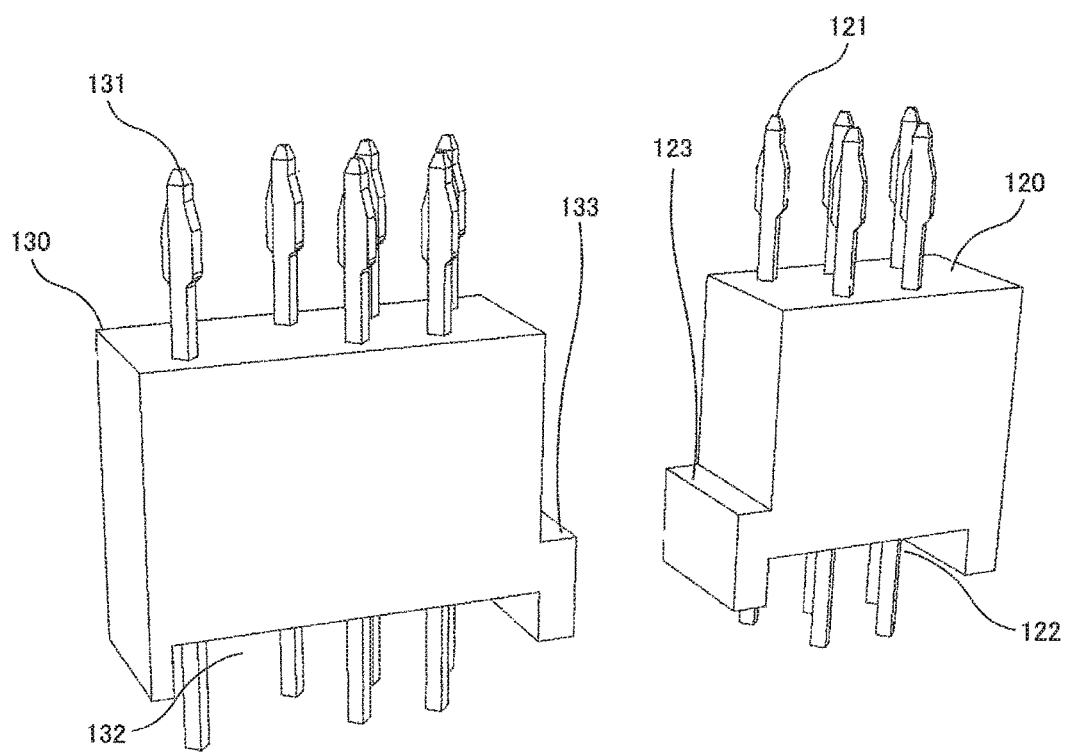
FIG. 4 is a perspective view of terminal blocks of the semiconductor device according to the first embodiment.
Figure 5:
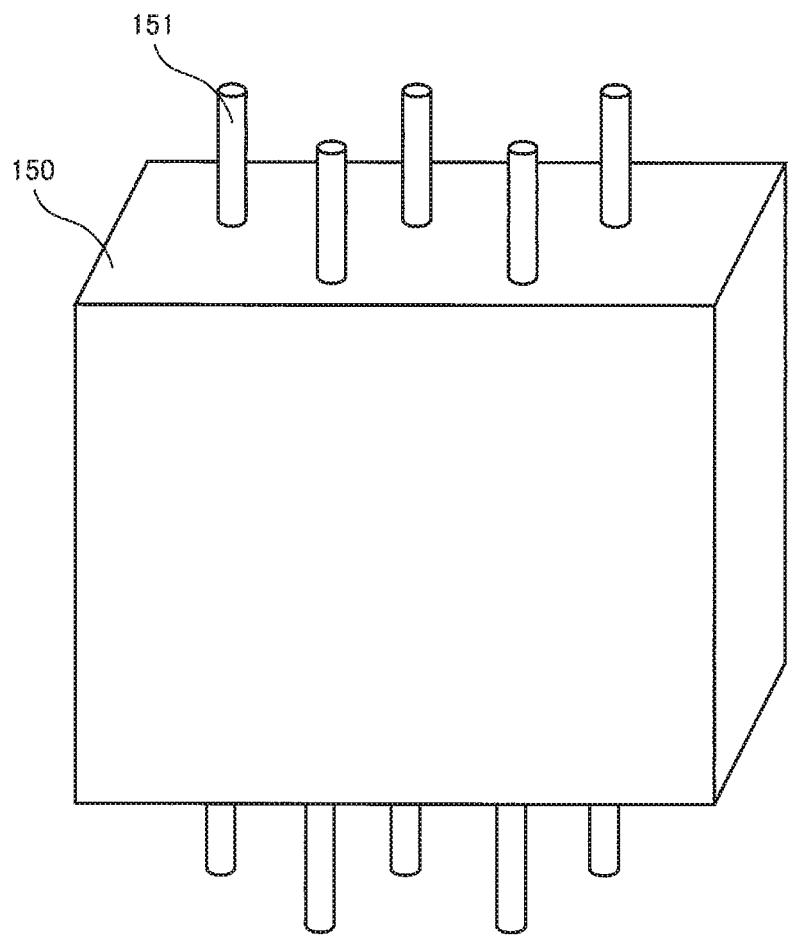
FIG. 5 is a perspective view of another example of terminal blocks of the semiconductor device according to the first embodiment.

FIG. 4 is a perspective view of the terminal blocks of the semiconductor device according to the first embodiment. FIG. 5 is a perspective view of another example of terminal blocks of the semiconductor device according to the first embodiment.

Figure 6:
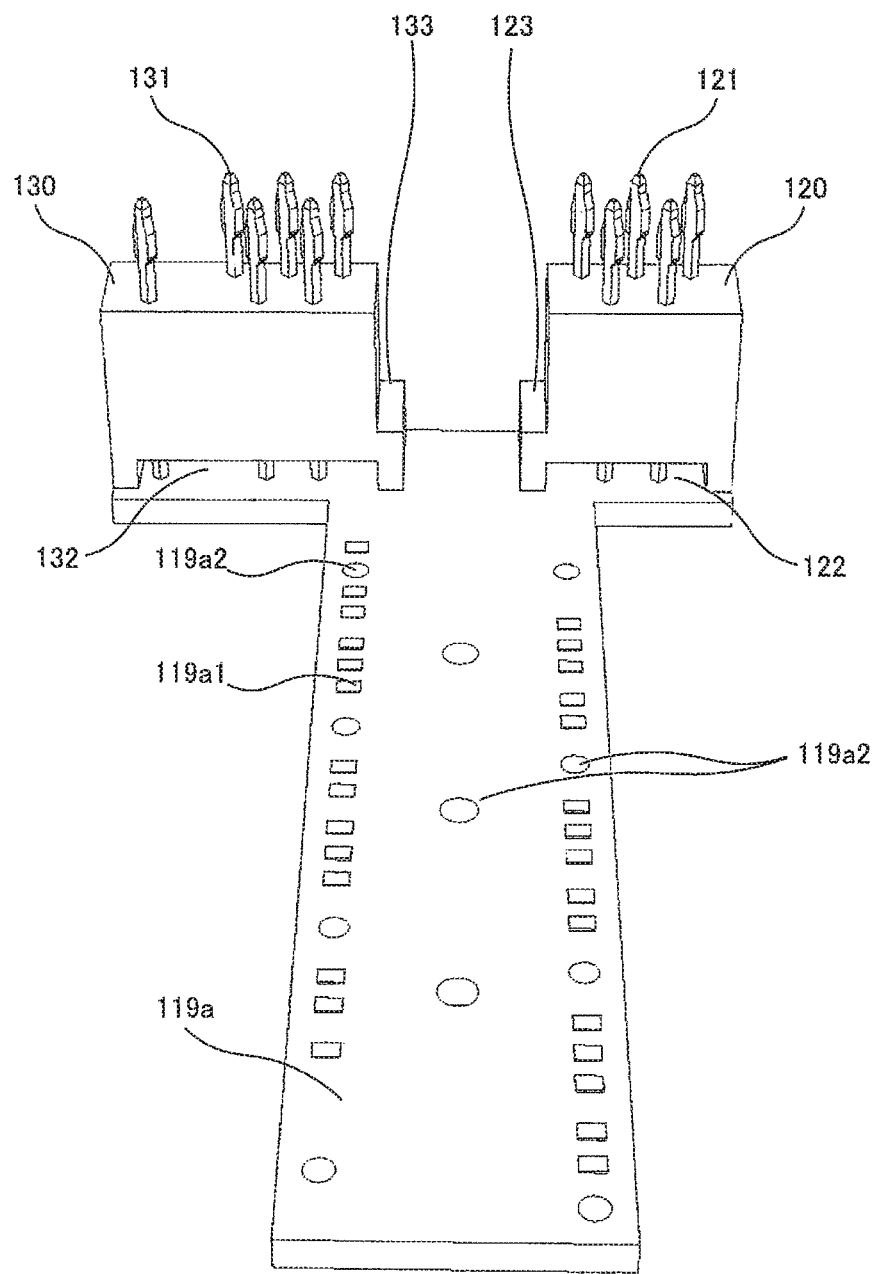
FIG. 6 is a perspective view of a printed circuit board and the terminal blocks of the semiconductor device according to the first embodiment (part 1)
Figure 7:
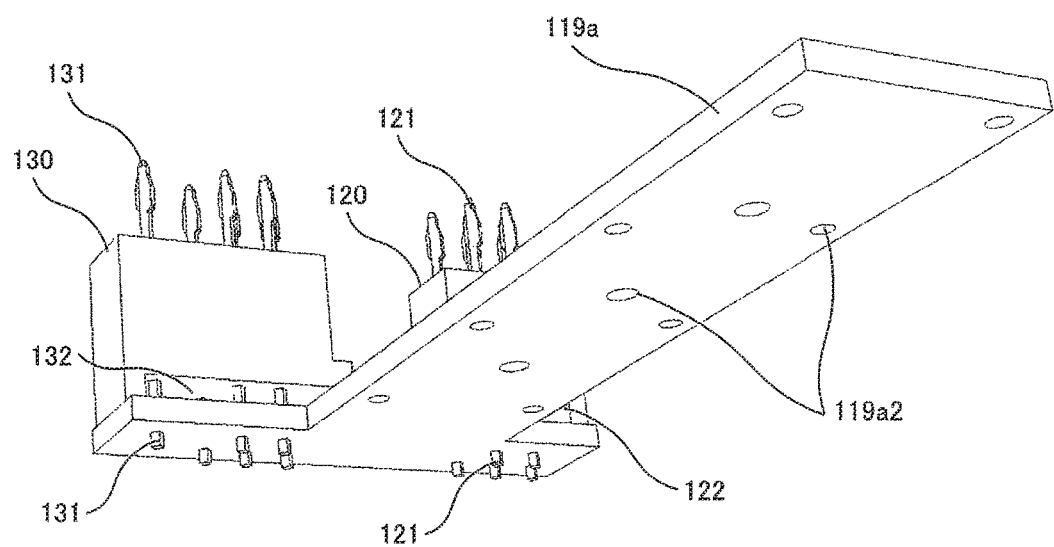
FIG. 7 is a perspective view of the printed circuit board and the terminal blocks of the semiconductor device according to the first embodiment (part 2)

Furthermore, each of FIGS. 6 and 7 is a perspective view of the printed circuit board and the terminal blocks of the semiconductor device according to the first embodiment. In FIGS. 6 and 7, the terminal blocks 120 and 130 are disposed over the printed circuit board 119a.

As illustrated in FIG. 4, the terminal blocks 120 and 130 are formed by integrally molding the control terminals (external connection terminals) 121 and 131, respectively, by the use of resin and have an almost cuboid shape. There are spaces 122 and 132 each defined by two protrusions on the under surface (second surface) side of the terminal blocks 120 and 130 respectively. The under surfaces of the terminal blocks 120 and 130 are opposite the printed circuit board 119a. The spaces 122 and 132 pierce the terminal blocks 120 and 130, respectively, from a front side to a back side in FIG. 4. Furthermore, level difference portions 123 and 133 are formed on facing surfaces of the terminal blocks 120 and 130 respectively. A terminal block 150 illustrated in FIG. 5 is formed by integrally molding control terminals 151 and the control terminals 151 protrude from upper and under surfaces of the terminal block 150. Each of the terminal blocks 120 and 130 may have a resin body like that of the terminal block 150 having a simple cuboid shape.

The above terminal blocks 120 and 130 hold a plurality of control terminals 121 and 131 respectively. Each control terminal 121 or each control terminal 131 has a structure in which both end portions are thicker than a body portion. The terminal blocks 120 and 130 hold the body portions of the above control terminals 121 and 131 respectively. Both end portions of the control terminals 121 and 131 which are thicker than the body portions protrude from upper surfaces (first surfaces) and the under surfaces (second surfaces) of the terminal blocks 120 and 130, respectively, illustrated in FIG. 4. As described later, lower end portions of the control terminals 121 and 131 which protrude on the under surface side of the terminal blocks 120 and 130, respectively, illustrated in FIG. 4 are press-fitted in through holes made in the printed circuit board 119a. In FIG. 6, the control terminals 121 and 131 are arranged in two rows in the terminal blocks 120 and 130 respectively. As a result, compared with a case where control terminals 121 and 131 are arranged in a row, the number of the control terminals 121 and 131 held by the terminal blocks 120 and 130, respectively, is large. Furthermore, control terminals 121 and 131 may be arranged in three or more rows in the terminal blocks 120 and 130 respectively. By doing so, the number of control terminals 121 and 131 held by the terminal blocks 120 and 130, respectively, increases further. The terminal blocks 120 and 130 are disposed over an end portion of the printed circuit board 119a.

The printed circuit board (circuit wiring board) 119a used for forming the case 110 includes a wiring layer made of a conductive material and a board made of a highly heat-resistant material. A plurality of electrodes 119a1 electrically connected to the wiring layer are arranged over a front surface of the printed circuit board 119a. The wiring layer may be a single layer, be formed over both surfaces of the printed circuit board 119a, or have a multilayer structure. In addition, a plurality of through holes 119a2 which pierce from an upper surface (first principal plane) to an under surface (second principal plane) are made in the printed circuit board 119a. As described later, the printed circuit board 119a is integrally molded with the case 110. At this time resin used for forming the case 110 gets into the through holes 119a2. As a result, the printed circuit board 119a easily adheres to the case 110. The plurality of through holes 119a2 are preferably arranged so that the plurality of electrodes 119a1 aligned will be sandwiched between them. The environs of the plurality of electrodes 119a1 are fixed with resin in the plurality of through holes 119a2. By doing so, the reliability of connection of wires 148 in a later step is improved.

Furthermore, a pattern made of, for example, copper may be formed over the back surface of the printed circuit board 119a and irregularities may intentionally be formed on a surface of the pattern by blackening treatment. As a result, when the printed circuit board 119a is integrally molded with the case 110, the irregularities over the back surface of the printed circuit board 119a fit the case 110 and the printed circuit board 119a easily adheres to the case 110. An allover pattern of a wiring layer on an under surface side may be used as a shield. A residue, such as resist, preferably is not left on the under surface of the printed circuit board 119a.

The lower end portions of the control terminals 121 and 131 protruding from the under surfaces of the terminal blocks 120 and 130, respectively, are connected to the above printed circuit board 119a by press-fitting and the terminal blocks 120 and 130 are disposed. As a result, the printed circuit board 119a and the control terminals 121 and 131 are electrically connected. As illustrated in FIG. 7, the lower end portions of the control terminals 121 and 131 may be exposed or protrude on an under surface side of the printed circuit board 119a.

If the lower end portions of the control terminals 121 and 131 are equal in thickness to the body portions of the control terminals 121 and 131, then the lower end portions of the control terminals 121 and 131 may be connected to the printed circuit board 119a not by press-fitting but by soldering. In this case, the lower end portions of the control terminals 121 and 131 which pierce the printed circuit board 119a (from the front surface side of the printed circuit board 119a) are soldered on a back surface side of the printed circuit board 119a. However, solder melts depending on temperature and molten solder may get into resin. In order to prevent molten solder from getting into resin, it is desirable to cover soldered portions of the control terminals 121 and 131 on the back surface side of the printed circuit board 119a with epoxy resin and to cure the epoxy resin. Accordingly, when the control terminals 121 and 131 are fitted in the printed circuit board 119a, it is desirable to perform press-fitting rather than soldering.

Furthermore, a control circuit may be formed over the printed circuit board 119a and electronic parts or the like electrically connected to the control terminals 121 and 131 may be mounted over the printed circuit board 119a. The printed circuit board 119b described later has the same structure as the printed circuit board 119a has, and is handled in the same way.

The above laminated substrate 140, printed circuit boards 119a and 119b, and terminal blocks 120 and 130 are prepared.

(Step S12) The case 110 is formed by integrally molding the printed circuit boards 119a and 119b over which the terminal blocks 120 and 130 are disposed, wiring terminals 116, 117, and 118, the P terminals 113a, 113b, and 113c, the N terminals 114a, 114b, and 114c, the U terminal 115a, the V terminal 115b, the W terminal 115c, and the like by the use of resin.

The case 110 formed in this way will be described by the use of FIGS. 9 and 10.

Figure 9:
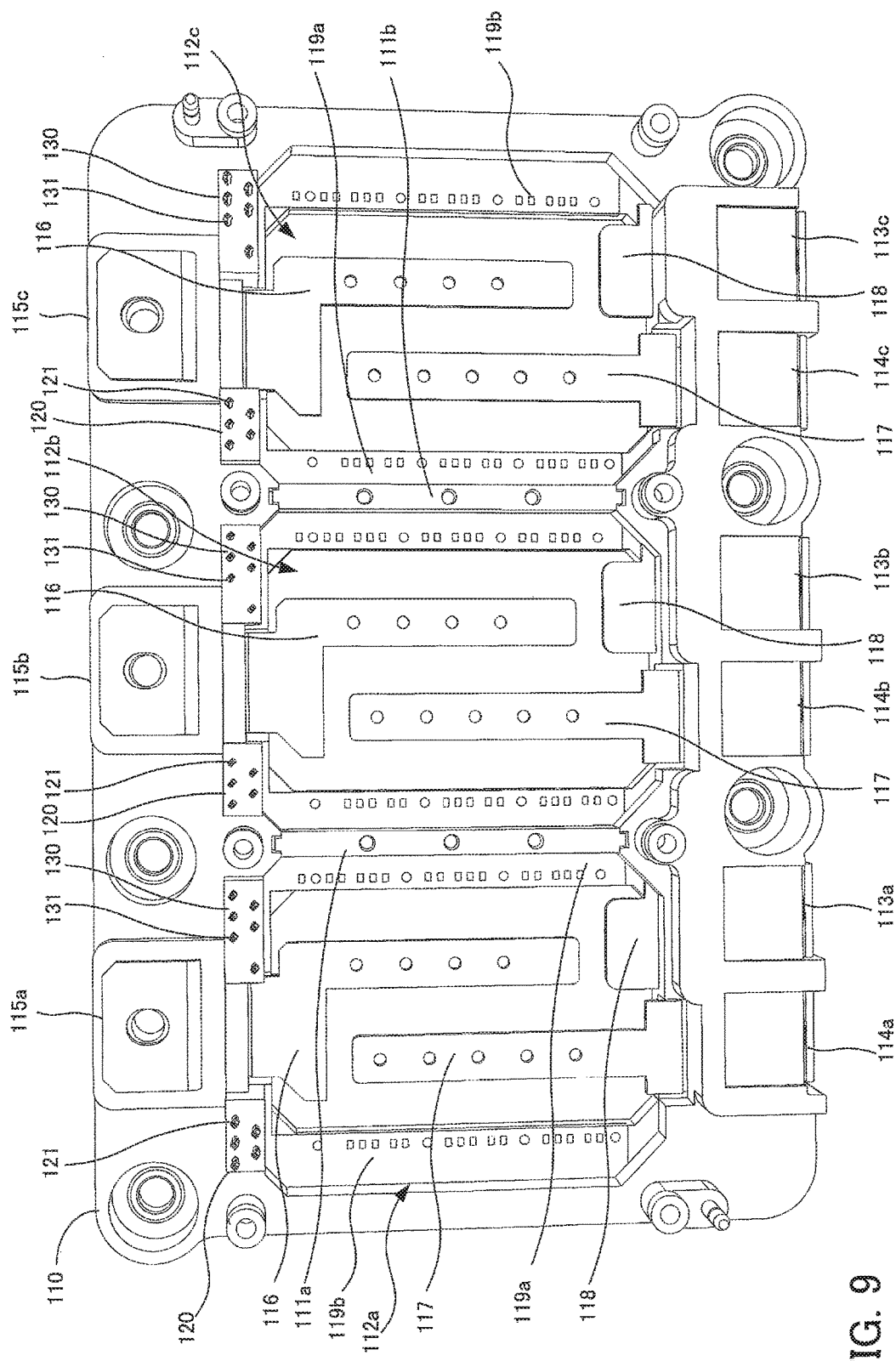
FIG. 9 is a plan view of a case of the semiconductor device according to the first embodiment.

FIG. 9 is a plan view of the case of the semiconductor device according to the first embodiment. FIG. 10 is a rear view of the case of the semiconductor device according to the first embodiment.

The case 110 is formed by, for example, injection molding by the use of resin and has the shape of a frame in whose central area a concavity is formed. The housing portions 112a, 112b, and 112c in which the above laminated substrates 140 are housed are formed in the concavity of the central area. The printed circuit boards 119a and 119b are disposed (in the lateral direction of the case 110) in peripheral portions of the housing portion 112a. A pair of printed circuit boards 119a are disposed (in the lateral direction of the case 110) in peripheral portions of the housing portion 112b. The printed circuit boards 119a and 119b are disposed (in the lateral direction of the case 110) in peripheral portions of the housing portion 112c. Furthermore, each printed circuit board 119a or each printed circuit board 119b is integrally molded with the case 110 and is disposed in the semiconductor device. A resin beam 111a or 111b made of resin is formed over a printed circuit board 119a disposed in this way. The case 110 withstands pressure applied in the lateral direction of the case 110 by the resin beams 111a and 111b.

With the housing portion 112a of the above case 110, the P terminal 113a and the N terminal 114a are formed on the side of one side in the longitudinal direction of the case 110 (on the lower side of the case 110 in FIG. 9) and the U terminal 115a is formed on the side of the other side in the longitudinal direction of the case 110 (on the upper side of the case 110 in FIG. 9). Similarly, with the housing portion 112b of the above case 110, the P terminal 113b and the N terminal 114b are formed on the side of one side in the longitudinal direction of the case 110 (on the lower side of the case 110 in FIG. 9) and the V terminal 115b is formed on the side of the other side in the longitudinal direction of the case 110 (on the upper side of the case 110 in FIG. 9). Furthermore, with the housing portion 112c of the above case 110, the P terminal 113c and the N terminal 114c are formed on the side of one side in the longitudinal direction of the case 110 (on the lower side of the case 110 in FIG. 9) and the W terminal 115c is formed on the side of the other side in the longitudinal direction of the case 110 (on the upper side of the case 110 in FIG. 9).

The wiring terminals 116 electrically connected to the U terminal 115a, the V terminal 115b, and the W terminal 115c are disposed in the housing portions 112a, 112b, and 112c respectively. The wiring terminals 116 extend in parallel with the printed circuit boards 119a and 119b to this side of the wiring terminals 118 described later. Furthermore, the wiring terminals 117 electrically connected to the N terminals 114a, 114b, and 114c are disposed in the housing portions 112a, 112b, and 112c respectively. The wiring terminals 117 extend in parallel with the printed circuit boards 119a and 119b from the N terminals 114a, 114b, and 114c to this side of the wiring terminals 116. Furthermore, the wiring terminals 118 electrically connected to the P terminals 113a, 113b, and 113c are disposed in the housing portions 112a, 112b, and 112c respectively. The wiring terminals 118 protrude from the P terminals 113a, 113b, and 113c.

In addition, the terminal blocks 120 and 130 are disposed over the printed circuit boards 119b and 119a, respectively, on a U terminal 115a side of the housing portion 112a and the control terminals 121 and 131 are electrically connected to the printed circuit boards 119b and 119a respectively. The terminal blocks 120 and 130 are disposed near the U terminal 115a, the V terminal 115b, and the W terminal 115c on the side in the longitudinal direction of the case 110.

The terminal blocks 120 and 130 are integrated with resin of the case 110 by integral molding. At secondary molding time the upper surfaces, the under surfaces, or the side surfaces (third surfaces) between the upper and under surfaces of the terminal blocks 120 and 130 are welded to the heated resin. As a result, the terminal blocks 120 and 130 are joined to the case 110. In the example of FIG. 9, the side surfaces of the terminal blocks 120 and 130 connect with the upper surfaces and under surfaces of the terminal blocks 120 and 130 respectively. Thermoplastic resin, such as polyphenylene sulfide (PPS), may be used as resin. When the terminal blocks 120 and 130 which hold the control terminals 121 and 131, respectively, are molded (primary molding), it is desirable to form the bodies of the terminal blocks 120 and 130 by the use of resin which is equal in kind to or the same as resin used for forming the case 110. Forming the bodies of the terminal blocks 120 and 130 and the case 110 by the use of resin materials of the same kind makes secondary molding easy.

In order to dispose part of the case 110 on an upper surface side of the level difference portions 123 and 133, at secondary molding time the level difference portions 123 and 133 are covered with resin and integral molding is performed. By doing so, the terminal blocks 120 and 130 and the case 110 may be joined firmly. The terminal blocks 120 and 130 and the case 110 are integrally molded so that the end portions of the control terminals 121 and 131 which are exposed or protrude on an under surface (second principal plane) side of the printed circuit boards 119a and 119b will be in contact with the case 110. By doing so, the printed circuit boards 119a and 119b are held (sandwiched) between the under surfaces (second surfaces) of the terminal blocks 120 and 130 and the case 110. As a result, the printed circuit boards 119a and 119b may be fixed firmly to the case 110. In addition, the following method may be used. Resin is poured into the spaces 122 and 132 of the terminal blocks 120 and 130 respectively. Part of the case 110 is disposed in the spaces 122 and 132, is joined to the terminal blocks 120 and 130, and is in contact with the control terminals 121 and 131. By adopting a sandwich structure, the printed circuit boards 119a and 119b adheres reliably to the case 110.

The printed circuit board 119a integrally molded with the case 110 by primary molding will now be described by the use of FIG. 8.

Figure 8:
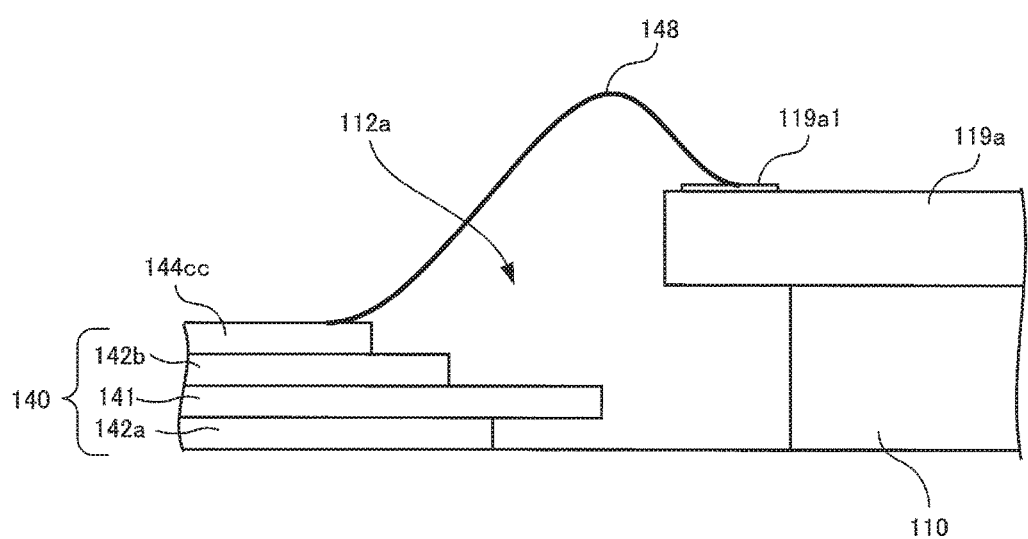
FIG. 8 is a fragmentary sectional view of the printed circuit board and a laminated substrate of the semiconductor device according to the first embodiment.

FIG. 8 is a fragmentary sectional view of the printed circuit board and the laminated substrate of the semiconductor device according to the first embodiment.

FIG. 8 is a fragmentary sectional view taken along the dot-dash line X-X of FIG. 1. As illustrated in FIG. 8, an end portion of the printed circuit board 119a projects from the case 110 into the inside of the housing portion (housing area) 112a, that is to say, to a laminated substrate 140 side. The projecting end portion is formed as a result of sandwiching the printed circuit board 119a by a metal mold at secondary molding time. Furthermore, as illustrated in FIGS. 6 and 7, the aligned electrodes 119a1 and through holes 119a2 of the printed circuit board 119a are disposed along the projecting end portion.

In step S12, a case where the wiring terminals 116 and 117 are integrally molded at the time of forming the case 110 is taken as an example. However, the case 110 may be formed by integrally molding the components other than the wiring terminals 116 and 117. In this case, the wiring terminals 116 and 117 are joined at determined positions by welding after the case 110 is formed.

(Step S13) The laminated substrates 140 prepared in step S11b are housed in the case 110 formed in step S12. The resin beams 111a and 111b are then attached over the printed circuit boards 119a.

To be concrete, the laminated substrate 140 described in FIG. 3 is placed over a, for example, copper plate or a cooler. The case 110 is adhered to the laminated substrate 140 placed over the copper plate or the cooler so that the laminated substrate 140 placed over the copper plate or the cooler will be housed in each of the housing portions 112a, 112b, and 112c of the case 110 described in FIGS. 9 and 10. At housing time the conductive terminal 143b and the lead frame 145a of the laminated substrate 140 are joined to (a back surface side of) the wiring terminal 116 of the case 110. Furthermore, the lead frame 145b of the laminated substrate 140 is joined to (a back surface side of) the wiring terminal 117 of the case 110. In addition, the conductive terminal 143a of the laminated substrate 140 is joined to (a back surface side of) the wiring terminal 118 of the case 110. After that, the resin beams 111a and 111b are attached over the printed circuit boards 119a.

(Step S14) The control electrodes, such as gate electrodes, of the semiconductor chips 144a, 144b, and 144c and the printed circuit board 119a are connected by wires 148 and the control electrodes, such as gate electrodes, of the semiconductor chips 146a, 146b, and 146c and the printed circuit board 119b are connected by wires 148.

As a result, the structure of the semiconductor device 100 illustrated in FIG. 1 is obtained.

It is desirable to dispose the semiconductor chips 144a, 144b, and 144c so that each control electrode will be aligned along the printed circuit board 119a. The same applies to the semiconductor chips 146a, 146b, and 146c. This disposition makes connection by the wires 148 easy. As illustrated in FIG. 3, the use of RC-IGBTs as the semiconductor chips 144a, 144b, 144c, 146a, 146b, and 146c makes alignment of the control electrodes easy.

(Step S15) The laminated substrates 140, the printed circuit boards 119a and 119b, the resin beams 111a and 111b, the wiring terminals 116, 117, and 118, the wires 148, and the like in the concavity of the case 110 are sealed by the use of sealing resin and the sealing resin is cured. As a result, the semiconductor device 100 is completed.

At this time resin may be poured into the spaces 122 and 132 of the terminal blocks 120 and 130, respectively, to seal the control terminals 121 and 131 in the spaces 122 and 132 with the resin. Performing sealing in this way makes adhesion of the control terminals 121 and 131 to the printed circuit boards 119a and 119b more reliable. In addition, when the terminal blocks 120 and 130 are sealed, the level difference portions 123 and 133 of the terminal blocks 120 and 130, respectively, may be covered with resin. By doing so, the terminal blocks 120 and 130 are pressed against the printed circuit boards 119a and 119b. As a result, adhesion of the control terminals 121 and 131 to the printed circuit boards 119a and 119b becomes more reliable. Accordingly, the positions of the level difference portions 123 and 133 are not limited to those illustrated in FIG. 4. There is no limit to the positions of the level difference portions 123 and 133 as long as they are formed on surfaces perpendicular to the surfaces of the terminal blocks 120 and 130 opposite the printed circuit board 119a. Furthermore, each of the level difference portions 123 and 133 may be formed not only on one surface but also on plural surfaces. For example, epoxy resin may be used as the sealing resin.

Circuit structure in the above semiconductor device 100 will now be described by the use of FIGS. 1, 3, and 11.

Figure 11:
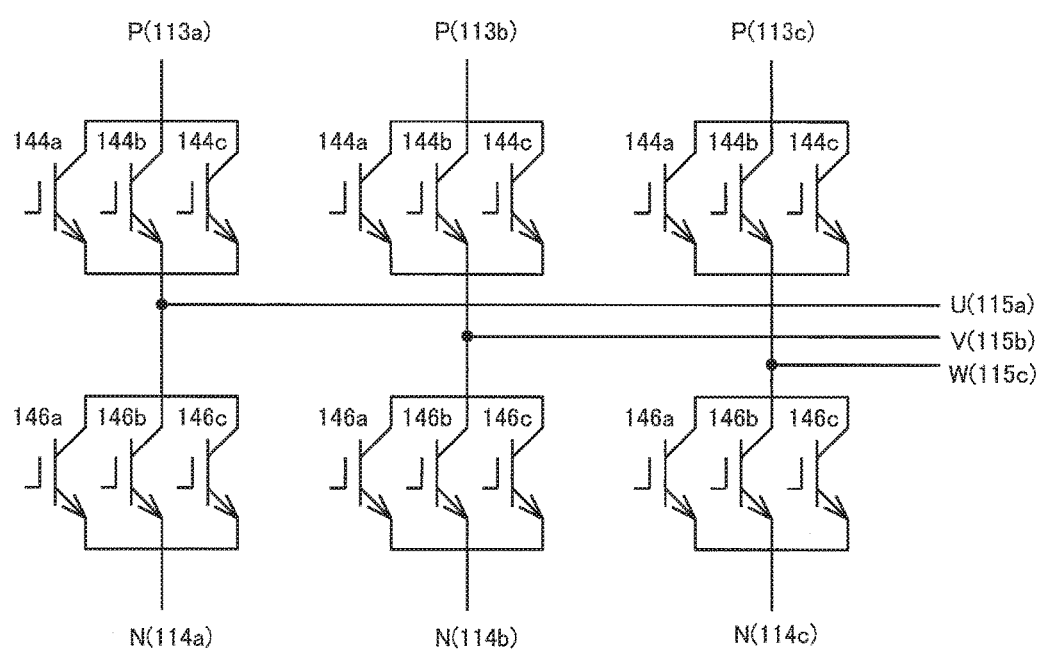
FIG. 11 is a circuit diagram which illustrates circuit structure in the semiconductor device according to the first embodiment.

FIG. 11 is a circuit diagram which illustrates circuit structure in the semiconductor device according to the first embodiment.

With the laminated substrate 140 in the housing portion 112a of the semiconductor device 100 (FIGS. 1 and 3) the conductive terminal 143a electrically connected to the P terminal 113a via the wiring terminal 118 is electrically connected to the collector electrodes of the semiconductor chips 144a, 144b, and 144c via the circuit board 142a. The wiring terminal 116 is electrically wired to the lead frame 145a electrically connected to the emitter electrodes of the semiconductor chips 144a, 144b and 144c, and is electrically connected to the U terminal 115a.

The conductive terminal 143b is electrically connected to the wiring terminal 116 electrically connected to the U terminal 115a, and is electrically connected to the collector electrodes of the semiconductor chips 146a, 146b and 146c via the circuit board 142b. The wiring terminal 117 is electrically wired to the lead frame 145b electrically connected to the emitter electrodes of the semiconductor chips 146a, 146b and 146c, and is electrically connected to the N terminal 114a.

Furthermore, with the laminated substrate 140 in the housing portion 112b of the semiconductor device 100 (FIGS. 1 and 3) the conductive terminal 143a electrically connected to the P terminal 113b via the wiring terminal 118 is electrically connected to the collector electrodes of the semiconductor chips 144a, 144b, and 144c via the circuit board 142a. The wiring terminal 116 is electrically wired to the lead frame 145a electrically connected to the emitter electrodes of the semiconductor chips 144a, 144b and 144c, and is electrically connected to the V terminal 115b.

The conductive terminal 143b is electrically connected to the wiring terminal 116 electrically connected to the V terminal 115b, and is electrically connected to the collector electrodes of the semiconductor chips 146a, 146b and 146c via the circuit board 142b. The wiring terminal 117 is electrically wired to the lead frame 145b electrically connected to the emitter electrodes of the semiconductor chips 146a, 146b and 146c, and is electrically connected to the N terminal 114b.

In addition, with the laminated substrate 140 in the housing portion 112c of the semiconductor device 100 (FIGS. 1 and 3) the conductive terminal 143a electrically connected to the P terminal 113c via the wiring terminal 118 is electrically connected to the collector electrodes of the semiconductor chips 144a, 144b, and 144c via the circuit board 142a. The wiring terminal 116 is electrically wired to the lead frame 145a electrically connected to the emitter electrodes of the semiconductor chips 144a, 144b and 144c, and is electrically connected to the W terminal 115c.

The conductive terminal 143b is electrically connected to the wiring terminal 116 electrically connected to the W terminal 115c, and is electrically connected to the collector electrodes of the semiconductor chips 146a, 146b and 146c via the circuit board 142b. The wiring terminal 117 is electrically wired to the lead frame 145b electrically connected to the emitter electrodes of the semiconductor chips 146a, 146b and 146c, and is electrically connected to the N terminal 114c.

By adopting the above structure, the circuit illustrated in FIG. 11 is formed in the semiconductor device 100.

Therefore, in a state in which the positive electrode is connected to the P terminal 113a and the negative electrode is connected to the N terminal 114a, control signals are inputted from or outputted to external circuits via the control terminals 121 and 131 and the printed circuit boards 119a and 119b. The control signals are inputted to the gate electrodes of the semiconductor chips 144a, 144b, and 144c and the semiconductor chips 146a, 146b, and 146c via the printed circuit boards 119a and 119b and the wires 148. An output is obtained from the U terminal 115a according to the control signals.

Furthermore, in a state in which the positive electrode is connected to the P terminal 113b and the negative electrode is connected to the N terminal 114b, control signals are inputted or outputted via the control terminals 121 and 131 and the printed circuit boards 119a and 119b. The control signals are inputted to the gate electrodes of the semiconductor chips 144a, 144b, and 144c and the semiconductor chips 146a, 146b, and 146c via the printed circuit boards 119a and 119b and the wires 148. An output is obtained from the V terminal 115b according to the control signals.

In addition, in a state in which the positive electrode is connected to the P terminal 113c and the negative electrode is connected to the N terminal 114c, control signals are inputted or outputted via the control terminals 121 and 131 and the printed circuit boards 119a and 119b. According to these control signals, control signals are inputted to the gate electrodes of the semiconductor chips 144a, 144b, and 144c and the semiconductor chips 146a, 146b, and 146c via the printed circuit boards 119a and 119b and the wires 148. An output is obtained from the W terminal 115c according to the control signals.

A semiconductor device other than the semiconductor device 100 will now be described as an example for reference by the use of FIG. 12.

Figure 12:
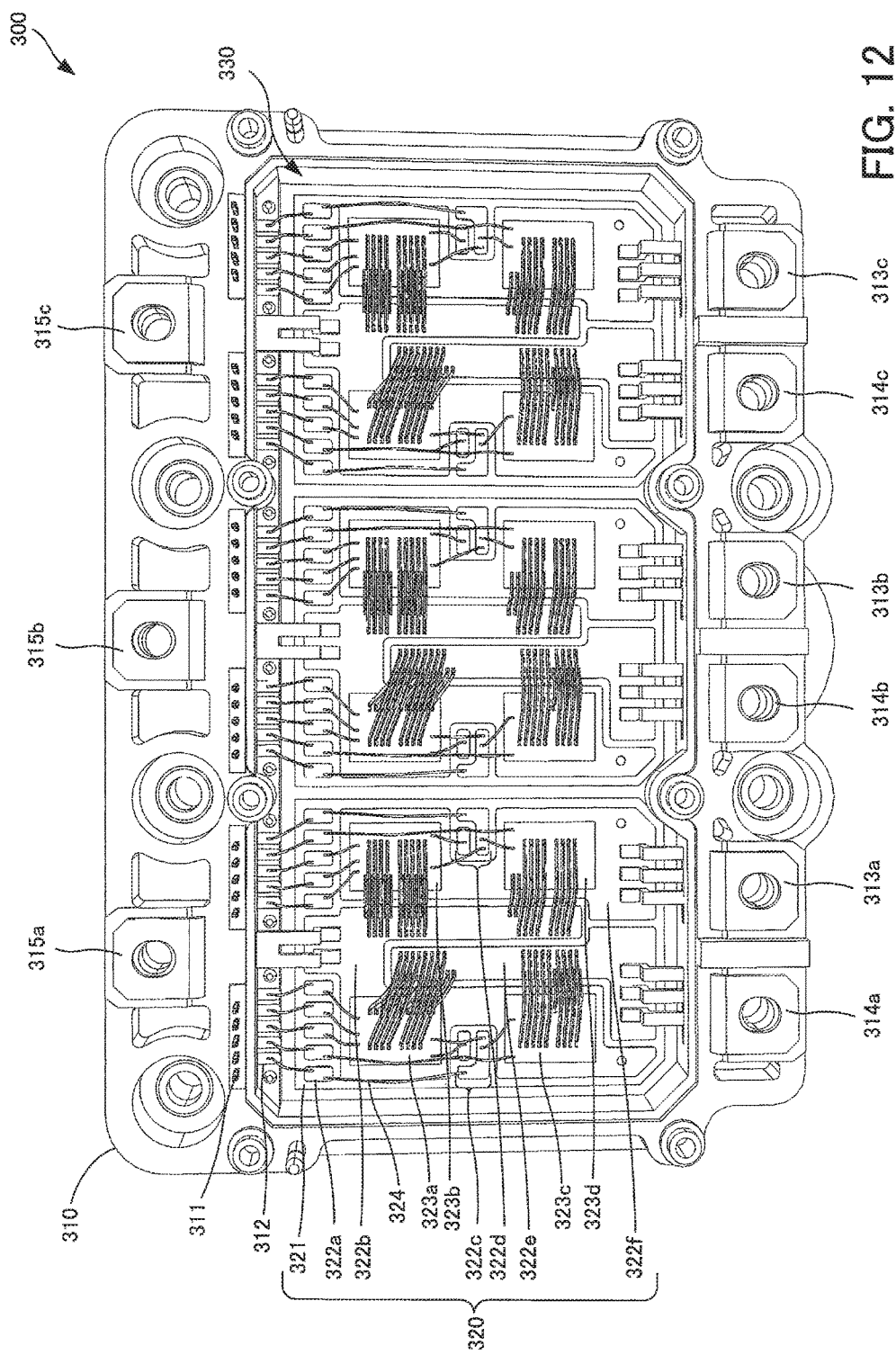
FIG. 12 is a plan view of a semiconductor device taken as an example for reference.

FIG. 12 is a plan view of a semiconductor device taken as an example for reference.

A semiconductor device 300 includes a case 310 and three laminated substrates 320 housed in a housing portion 330 formed in a central area of the case 310.

The case 310 is formed by injection molding by the use of resin. Control terminals 311, control electrodes 312 electrically connected to the control terminals 311, P terminals 313a, 313b, and 313c, N terminals 314a, 314b, and 314c, a U terminal 315a, a V terminal 315b, and a W terminal 315c are integrally molded.

The laminated substrate 320 includes a radiation plate (not illustrated) formed over an under surface of an insulating substrate 321 and circuit boards 322a, 322b, 322c, 322d, 322e, and 322f formed over an upper surface of the insulating substrate 321. In addition, semiconductor chips 323a and 323c and semiconductor chips 323b and 323d are disposed over the circuit boards 322b and 322f, respectively, with solder therebetween.

The above laminated substrate 320 is housed in the housing portion 330 of the case 310. The control electrodes 312, the circuit boards 322a, 322c, and 322d, and main terminals of the semiconductor chips 323a, 323b, 323c, and 323d are connected by wires 324.

As illustrated in FIG. 12, with the above semiconductor device 300 wiring routing is performed from the control electrodes 312 electrically connected to the control terminals 311 to the circuit boards 322c and 322d in order to input control signals to the semiconductor chips 323a, 323b, 323c, and 323d. In addition, ten wires 324 are wired from each of the semiconductor chips 323a, 323b, 323c, and 323d. That is to say, wiring of wires 324 is complicated. Such wiring deteriorates assemble-ability and increases man-hours needed for wiring work. Furthermore, with wirings of a control signal system a magnetic field or the like produced at switching time has an influence on the characteristics of a product, depending on a routing method. As a result, a malfunction may occur.

With the semiconductor device 100, on the other hand, the printed circuit boards 119a and 119b are disposed in the peripheral portions of the housing portions 112a, 112b, and 112c of the case 110 in which the laminated substrates 140 are housed. The terminal blocks 120 and 130 which hold the control terminals 121 and 131, respectively, that output control signals to the printed circuit boards 119a and 119b are disposed over the printed circuit boards 119a and 119b. The gate electrodes of the semiconductor chips 144a, 144b, and 144c and the semiconductor chips 146a, 146b, and 146c and the printed circuit boards 119a and 119b, respectively, are electrically connected by the wires 148.

This leads to wiring simplification in a control signal system of the semiconductor device 100. Accordingly, wiring routing and bundling are easily controlled. As a result, assemble-ability is improved and an increase in man-hours needed for wiring work is checked. Furthermore, complicated routing is avoided, mis-wiring is suppressed, and the number of parts, such as circuit patterns and electrode pads, is reduced. Accordingly, the semiconductor device 100 is miniaturized. In addition, because wiring simplification and consistency are realized in the control signal system of the semiconductor device 100, the influence of a magnetic field or the like produced at switching time on the characteristics of a product is alleviated and the occurrence of a malfunction is suppressed.

(Second Embodiment)

In a second embodiment another semiconductor device will be described by the use of FIG. 13.

Figure 13:
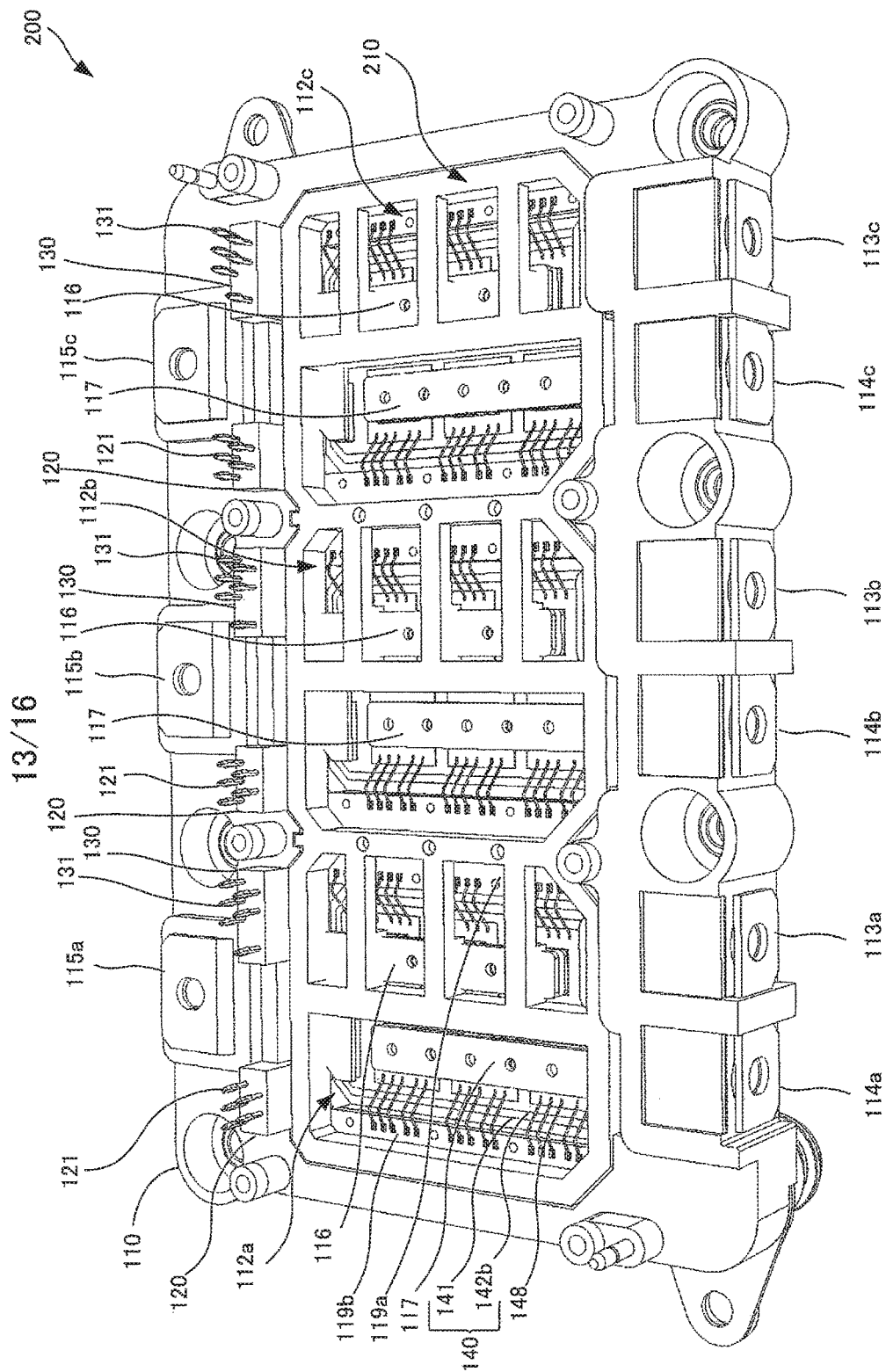
FIG. 13 is a perspective view of a semiconductor device according to a second embodiment.

FIG. 13 is a perspective view of a semiconductor device according to a second embodiment.

With a semiconductor device 200 a bus bar block 210 formed by integrally molding the wiring terminals 116 and 117 of the semiconductor device 100 according to the first embodiment (FIG. 1) is mounted in a concavity in the central area.

The structure except wiring terminals 116 and 117 of a case 110 of the semiconductor device 200 is the same as that of the case 110 of the semiconductor device 100. Laminated substrates 140 in the semiconductor device 200 are equal in structure to the laminated substrates 140 in the semiconductor device 100.

Furthermore, circuit structure in the semiconductor device 200 is equal to the circuit structure in the semiconductor device 100 according to the first embodiment (FIG. 11).

A method for fabricating the above semiconductor device 200 will be described by the use of FIG. 14.

Figure 14:
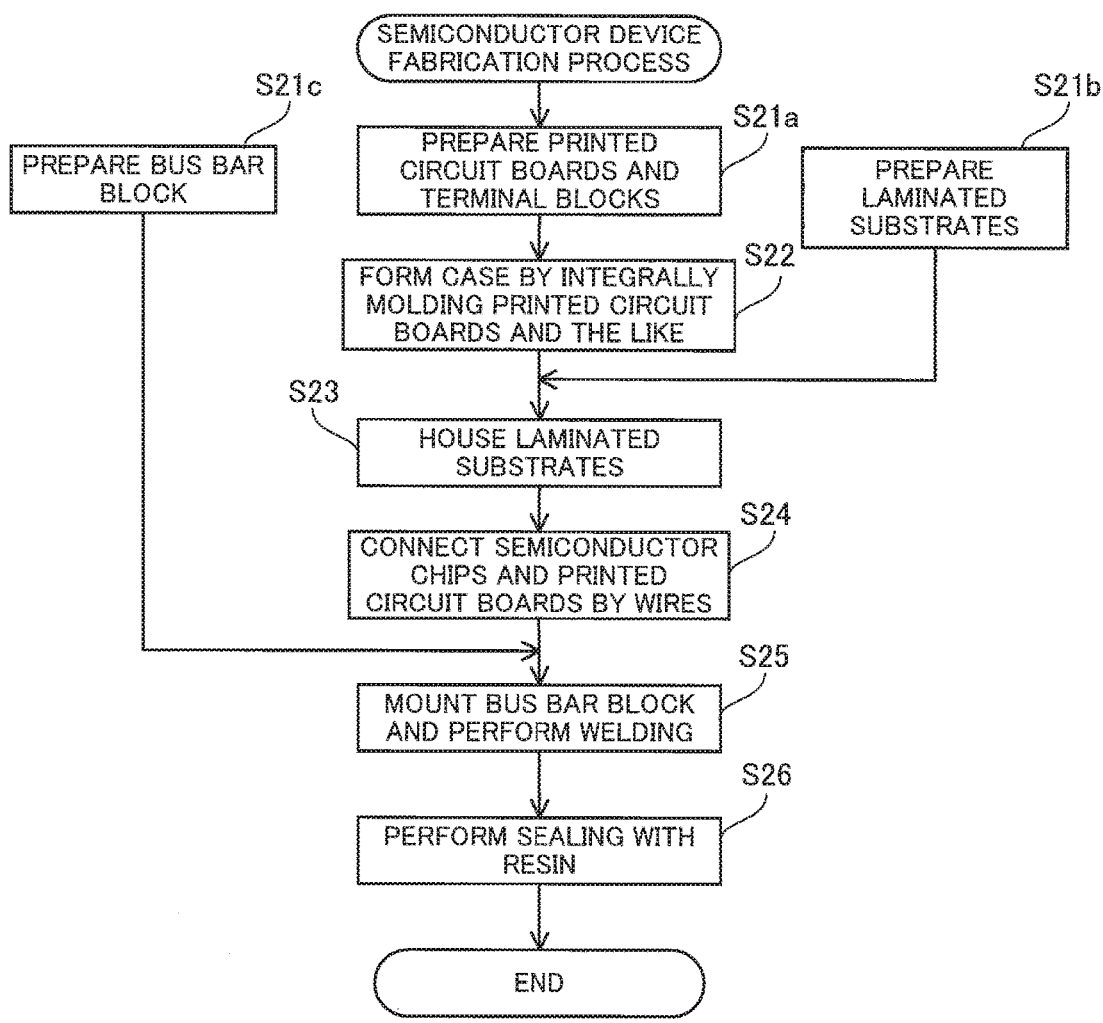
FIG. 14 is a flow chart of a method for fabricating the semiconductor device according to the second embodiment.

FIG. 14 is a flow chart of a method for fabricating the semiconductor device according to the second embodiment.

(Step S21) Printed circuit boards 119a and 119b and terminal blocks 120 and 130 are prepared (step S21a). Furthermore, the laminated substrates 140 are prepared (step S21b). In addition, the bus bar block 210 is prepared (step S21c). In step S21a, control terminals 121 and 131 of the terminal blocks 120 and 130, respectively, are press-fitted in the printed circuit boards 119a and 119b to hold the printed circuit boards 119a and 119b on an under surface side of the terminal blocks 120 and 130.

The structure of the laminated substrates 140 (FIG. 3) and the structure of the terminal blocks 120 and 130 (FIGS. 4 through 7) are described in the first embodiment.

The bus bar block 210 will be described by the use of FIG. 15.

Figure 15:
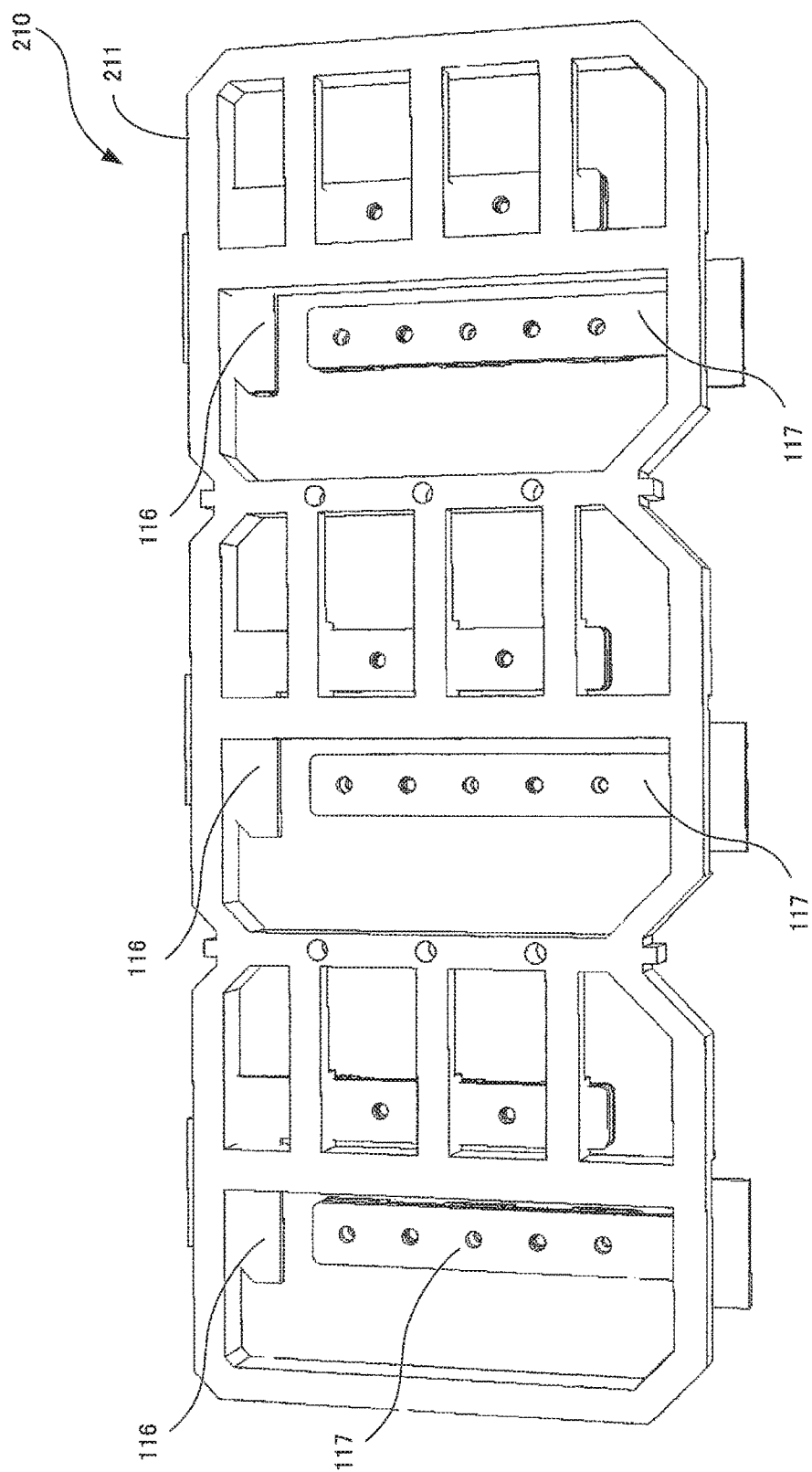
FIG. 15 is a plan view of a bus bar block of the semiconductor device according to the second embodiment.

FIG. 15 is a plan view of the bus bar block of the semiconductor device according to the second embodiment.

The bus bar block 210 is formed by the use of resin. For example, more than one frame is combined into a framework so that it will fit into the concavity in the central area of the semiconductor device 200. In addition, for example, the wiring terminals 116 and 117 corresponding to housing portions 112a, 112b, and 112c are integrally molded on a back surface side of the frames combined in this way.

(Step S22) The case 110 is formed by integrally molding the printed circuit boards 119a and 119b, the terminal blocks 120 and 130, wiring terminals 118, P terminals 113a, 113b, and 113c, N terminals 114a, 114b, and 114c, a U terminal 115a, a V terminal 115b, and a W terminal 115c by the use of resin.

Figure 10:
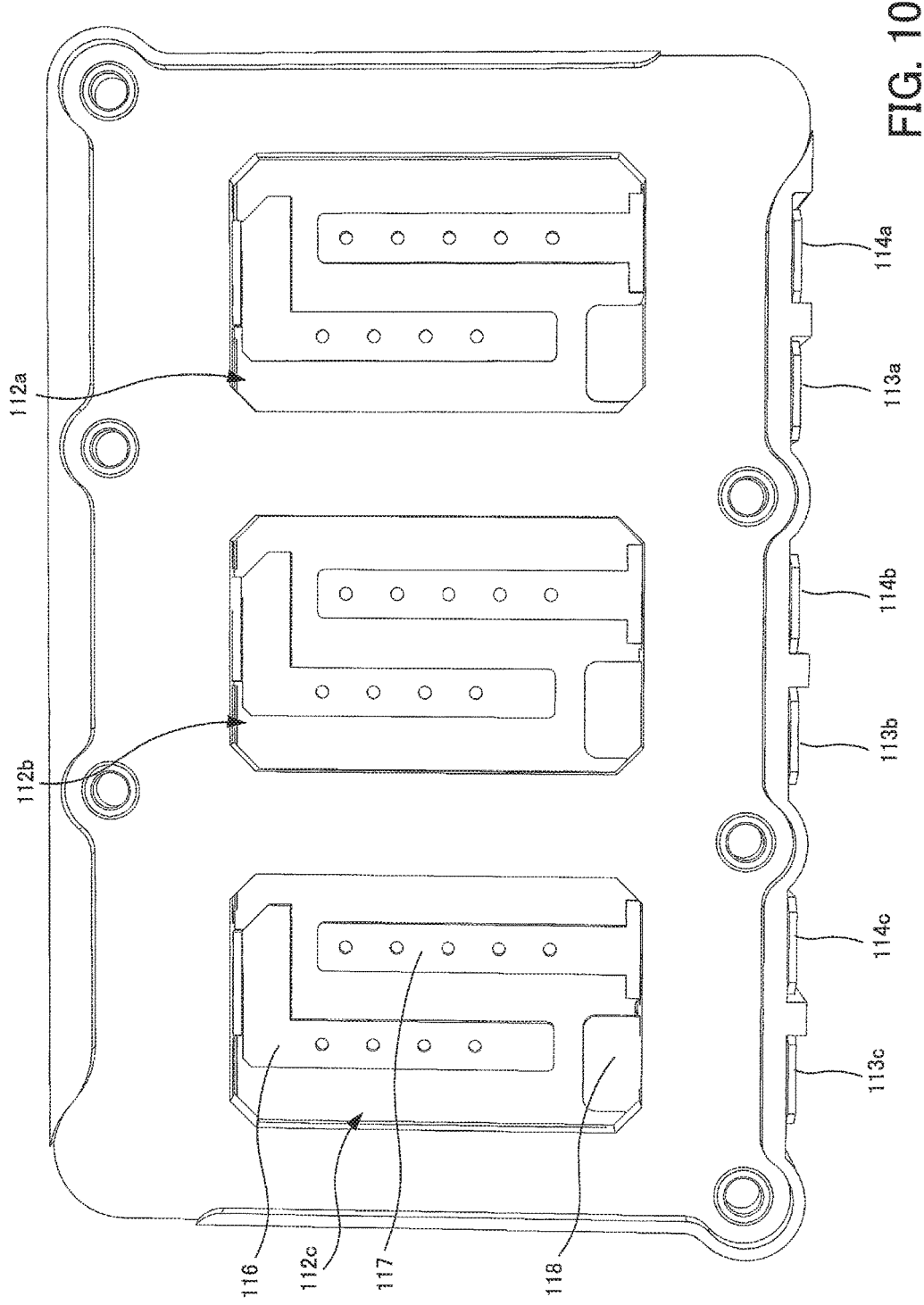
FIG. 10 is a rear view of the case of the semiconductor device according to the first embodiment.

That is to say, the case 110 formed in step S22 corresponds to the case 110 in the first embodiment illustrated in FIGS. 9 and 10 from which the wiring terminals 116 and 117 and the resin beams 111a and 111b have been removed.

(Step S23) The laminated substrates 140 prepared in step S21b are housed in the case 110 formed in step S22.

To be concrete, the laminated substrate 140 described in FIG. 3 is placed over a, for example, copper plate or a cooler. The case 110 is adhered to the laminated substrate 140 placed over the copper plate or the cooler so that the laminated substrate 140 placed over the copper plate or the cooler will be housed in each of the housing portions 112a, 112b, and 112c of the case 110 formed in step S22. At this time a conductive terminal 143a of the laminated substrate 140 in the housing portion 112a is joined to the wiring terminal 118 electrically connected to the P terminal 113a. A conductive terminal 143a of the laminated substrate 140 in the housing portion 112b is joined to the wiring terminal 118 electrically connected to the P terminal 113b. A conductive terminal 143a of the laminated substrate 140 in the housing portion 112c is joined to the wiring terminal 118 electrically connected to the P terminal 113c.

(Step S24) Semiconductor chips 144a, 144b, and 144c and semiconductor chips 146a, 146b and 146c and the printed circuit boards 119a and 119b, respectively, are connected by wires 148.

The connection by the wires 148 will now be described by the use of FIG. 16.

Figure 16:
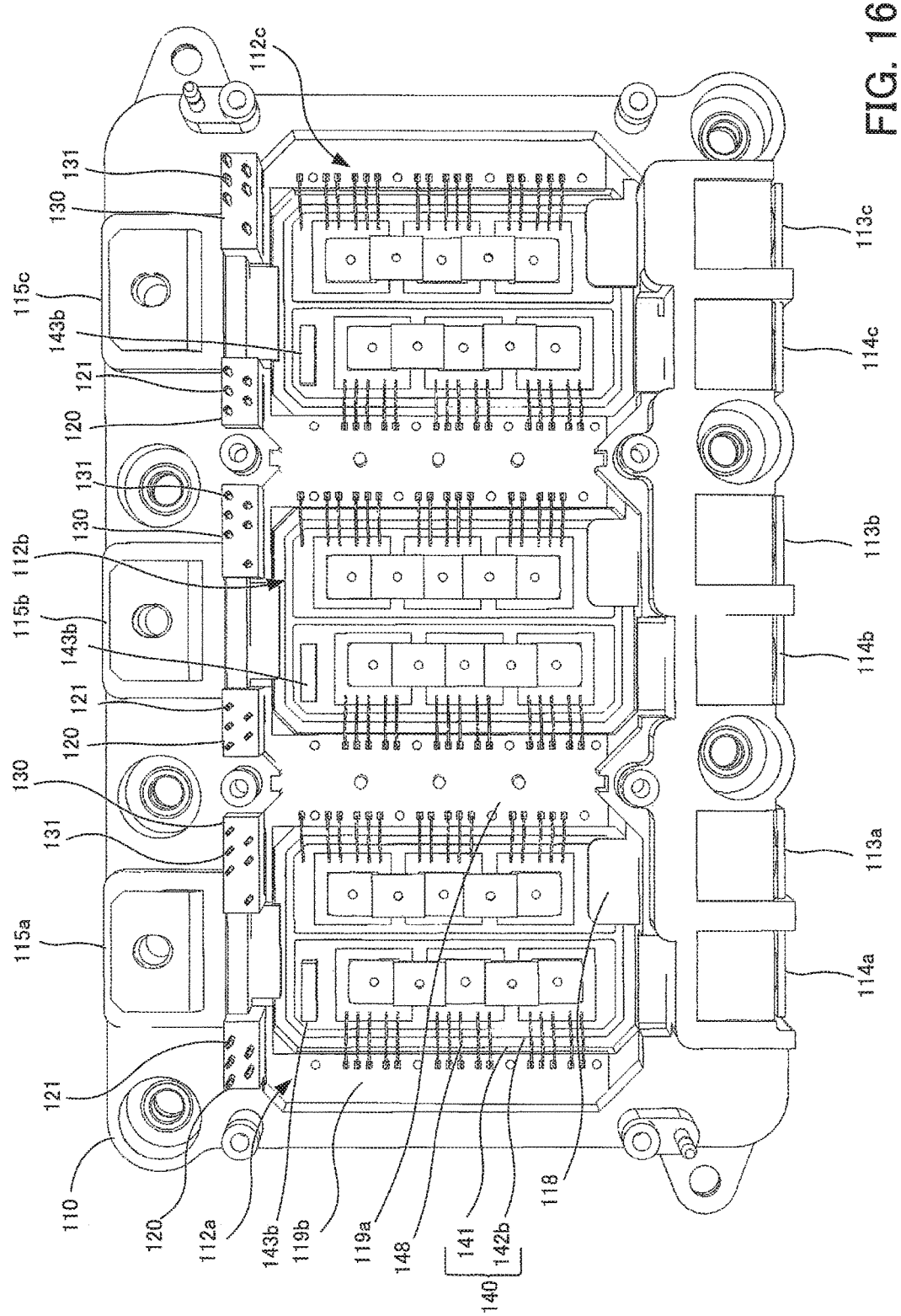
FIG. 16 is a plan view of a case of the semiconductor device according to the second embodiment in which insulating substrates are housed.

FIG. 16 is a plan view of the case of the semiconductor device according to the second embodiment in which insulating substrates are housed.

As illustrated in FIG. 16, gate electrodes of the semiconductor chips 144a, 144b, and 144c and the printed circuit board 119a are connected by the wires 148 and gate electrodes of the semiconductor chips 146a, 146b, and 146c and the printed circuit board 119b are connected by the wires 148.

(Step S25) The bus bar block 210 (FIG. 15) prepared in step S21c is mounted in the concavity in the central area of the case 110 obtained in this way. The laminated substrates 140 are housed in the case 110 and the semiconductor chips 144a, 144b, and 144c and the semiconductor chips 146a, 146b and 146c and the printed circuit boards 119a and 119b, respectively, are connected by the wires 148. Next, the wiring terminals 116 are joined to conductive terminals 143b and lead frames 145a by welding and the wiring terminals 117 are joined to lead frames 145b by welding.

At this time, in the housing portion 112a, the wiring terminal 116 of the bus bar block 210 is electrically connected to the conductive terminal 143b and the lead frame 145a of the laminated substrate 140 and is electrically connected to the U terminal 115a. Furthermore, the wiring terminal 117 of the bus bar block 210 is electrically connected to the lead frame 145b of the laminated substrate 140.

Furthermore, in the housing portion 112b, the wiring terminal 116 of the bus bar block 210 is electrically connected to the conductive terminal 143b and the lead frame 145a of the laminated substrate 140 and is electrically connected to the V terminal 115b. Furthermore, the wiring terminal 117 of the bus bar block 210 is electrically connected to the lead frame 145b of the laminated substrate 140.

In addition, in the housing portion 112c, the wiring terminal 116 of the bus bar block 210 is electrically connected to the conductive terminal 143b and the lead frame 145a of the laminated substrate 140 and is electrically connected to the W terminal 115c. Furthermore, the wiring terminal 117 of the bus bar block 210 is electrically connected to the lead frame 145b of the laminated substrate 140.

The structure of the semiconductor device 200 illustrated in FIG. 13 is obtained in this way.

(Step S26) The laminated substrates 140, the printed circuit boards 119a and 119b, the wires 148, the bus bar block 210, and the like in the concavity of the case 110 are sealed by the use of sealing resin and the sealing resin is cured. As a result, the semiconductor device 200 is completed.

As has been described, with the semiconductor device 200 the printed circuit boards 119a and 119b are disposed in peripheral portions of the housing portions 112a, 112b, and 112c of the case 110 in which the laminated substrates 140 are housed. The terminal blocks 120 and 130 which hold the control terminals 121 and 131, respectively, that output control signals to the printed circuit boards 119a and 119b are disposed over the printed circuit boards 119a and 119b. The gate electrodes of the semiconductor chips 144a, 144b, and 144c and the printed circuit board 119a are electrically connected by the wires 148 and the gate electrodes of the semiconductor chips 146a, 146b, and 146c and the printed circuit board 119b are electrically connected by the wires 148.

This leads to wiring simplification in a control signal system of the semiconductor device 200. Accordingly, wiring routing and bundling are easily controlled. As a result, assemble-ability is improved and an increase in man-hours needed for wiring work is checked. Furthermore, complicated routing is avoided, mis-wiring is suppressed, and the number of parts, such as circuit patterns and electrode pads, is reduced. Accordingly, the semiconductor device 200 is miniaturized. In addition, because wiring simplification and consistency are realized in the control signal system of the semiconductor device 200, the influence of a magnetic field or the like produced at switching time on the characteristics of a product is alleviated and the occurrence of a malfunction is suppressed.

Furthermore, with the semiconductor device 200 the wiring terminals 116 and 117 are fitted in the housing portions 112a, 112b, and 112c only by mounting the bus bar block 210 having the wiring terminals 116 and 117 in the concavity in the central area of the semiconductor device 200. Therefore, the assemble-ability of the wiring terminals 116 and 117 is improved and man-hours needed for assembling the wiring terminals 116 and 117 are reduced. In addition, because the semiconductor device 200 includes the bus bar block 210, the rigidity is improved and deformation of the semiconductor device 200 by bending or twisting caused by shock from the outside or the like is small. This prevents shock, damage, or the like to the semiconductor chips 144a, 144b, and 144c and the semiconductor chips 146a, 146b and 146c in the semiconductor device 200.

According to the disclosed techniques, wiring connection is simplified.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
a laminated substrate including an insulating board and a circuit board disposed over a front surface of the insulating board;
a semiconductor chip disposed over the circuit board;
a case having a housing area for housing the laminated substrate and the semiconductor chip;
a terminal block having a first surface and a second surface opposite the first surface and holding external connection terminals protruding from the first surface and the second surface; and
a printed circuit board having a first principal plane and a second principal plane opposite the first principal plane, disposed over a periphery of the housing area, held on a second surface side of the terminal block, electrically connected to a control electrode of the semiconductor chip by a connecting member, and connected to the external connection terminals by press-fitting,
wherein:
the terminal block has protrusions on the second surface side which define a space between the terminal block and the printed circuit board; and
part of the case is disposed in the space, is joined to the terminal block, and is in contact with the external connection terminals.

2. The semiconductor device according to claim 1, wherein:
the terminal block has a third surface between the first surface and the second surface which connects with the first surface; and
at least one of the second surface or the third surface is joined to the case.

3. The semiconductor device according to claim 1, wherein the printed circuit board has a plurality of through holes and is joined to the case at the plurality of through holes.

4. The semiconductor device according to claim 3, wherein an end portion of the printed circuit board projects from the case into an inside of the housing area.

5. The semiconductor device according to claim 2, wherein:
the terminal block has a level difference on the third surface; and
part of the case is disposed on a first surface side of the level difference.

6. The semiconductor device according to claim 1, wherein:
the terminal block is disposed on a first principal plane side of the printed circuit board;
end portions of the external connection terminals are exposed or protrude on a second principal plane side of the printed circuit board and are in contact with the case; and
the printed circuit board is held between the second surface of the terminal block and the case.

7. The semiconductor device according to claim 1, wherein:
the semiconductor chip included in the semiconductor device is provided in a plurality of semiconductor chips;
the plurality of semiconductor chips are disposed over the circuit board of the laminated substrate along the printed circuit board; and
control electrodes of the plurality of semiconductor chips are disposed along the printed circuit board and are electrically connected to the printed circuit board.

8. The semiconductor device according to claim 7, further comprising wiring terminals disposed along the printed circuit board and connected to main electrodes of each of the plurality of semiconductor chips.

9. The semiconductor device according to claim 8, further comprising a bus bar block which fits in the periphery, which covers the housing area, and which has the wiring terminals.

10. A semiconductor device comprising:
a laminated substrate including an insulating board and a circuit board disposed over a front surface of the insulating board;
a semiconductor chip disposed over the circuit board;
a case having a housing area for housing the laminated substrate and the semiconductor chip;
a terminal block having a first surface and a second surface opposite the first surface and holding external connection terminals protruding respectively from the first surface and the second surface in opposite directions;
a printed circuit board having a first principal plane and a second principal plane opposite the first principal plane, disposed over a periphery of the housing area, held on a second surface side of the terminal block, electrically connected to a control electrode of the semiconductor chip by a connecting member, and connected to the external connection terminals by press-fitting, wherein
the semiconductor chip included in the semiconductor device is provided in a plurality of semiconductor chips,
the plurality of semiconductor chips are disposed over the circuit board of the laminated substrate along the printed circuit board, and
control electrodes of the plurality of semiconductor chips are disposed along the printed circuit board and are electrically connected to the printed circuit board;
wiring terminals disposed along the printed circuit board and connected to main electrodes of each of the plurality of semiconductor chips; and
a bus bar block which fits in the periphery, which covers the housing area, and which has the wiring terminals.

11. A semiconductor device comprising:
a laminated substrate including an insulating board and a circuit board disposed over a front surface of the insulating board;
a semiconductor chip disposed over the circuit board;
a case having a housing area for housing the laminated substrate and the semiconductor chip;
a terminal block having a first surface and a second surface opposite the first surface and holding external connection terminals protruding from the first surface and the second surface;
a printed circuit board having a first principal plane and a second principal plane opposite the first principal plane, disposed over a periphery of the housing area, held on a second surface side of the terminal block, electrically connected to a control electrode of the semiconductor chip by a connecting member, and connected to the external connection terminals by press-fitting, wherein
the printed circuit board has a plurality of through holes and is joined to the case by resin which the case is made of, and the resin gets into the plurality of through holes,
the semiconductor chip included in the semiconductor device is provided in a plurality of semiconductor chips,
the plurality of semiconductor chips are disposed over the circuit board of the laminated substrate along the printed circuit board, and
control electrodes of the plurality of semiconductor chips are disposed along the printed circuit board and are electrically connected to the printed circuit board;
wiring terminals disposed along the printed circuit board and connected to main electrodes of each of the plurality of semiconductor chips; and
a bus bar block which fits in the periphery, which covers the housing area, and which has the wiring terminals.

12. The semiconductor device according to claim 11, further comprising:
a plurality of electrodes arranged over a front surface of the printed circuit board, wherein
the plurality of electrodes are aligned and are sandwiched between the plurality of through holes.

13. The semiconductor device according to claim 1, wherein the terminal block is welded to the case.

* * * * *